(12) United States Patent
Sasaoka et al.

(10) Patent No.: US 7,659,148 B2
(45) Date of Patent: Feb. 9, 2010

(54) BONDING METHOD AND APPARATUS

(75) Inventors: Tatsuo Sasaoka, Osaka (JP); Satoshi Horie, Osaka (JP); Isamu Aokura, Osaka (JP); Yoshihiko Yagi, Hyogo (JP); Kazuki Fukada, Osaka (JP)

(73) Assignee: Panasonic Corporation, Osaka (JP)

( * ) Notice: Subject to any disclaimer, the term of this patent is extended or adjusted under 35 U.S.C. 154(b) by 189 days.

(21) Appl. No.: 10/599,638

(22) PCT Filed: Apr. 6, 2005

(86) PCT No.: PCT/JP2005/006740

§ 371 (c)(1),
(2), (4) Date: Oct. 4, 2006

(87) PCT Pub. No.: WO2005/097396

PCT Pub. Date: Oct. 20, 2005

(65) Prior Publication Data

US 2007/0193682 A1  Aug. 23, 2007

(30) Foreign Application Priority Data

Apr. 8, 2004  (JP) .............................. 2004-113920

(51) Int. Cl.
  H01L 21/60    (2006.01)
  H01L 21/603   (2006.01)
  H05K 3/32     (2006.01)
  H01L 21/58    (2006.01)

(52) U.S. Cl. .................. 438/118; 438/455; 438/974; 257/E21.499; 257/E21.506

(58) Field of Classification Search ................. 438/455, 438/906, 909, 928, 974, 118; 174/260; 257/E21.499, 257/E21.506

See application file for complete search history.

(56) References Cited

U.S. PATENT DOCUMENTS 5,634,268 A    6/1997  Dalal et al.
6,153,495 A *  11/2000 Kub et al. ............... 438/459
6,680,221 B2   1/2004  Tokunaga et al.
6,784,554 B2   8/2004  Kajiwara et al.
6,902,101 B2   6/2005  Horie et al.
6,902,987 B1 * 6/2005  Tong et al. .............. 438/455
2003/0168145 A1 9/2003 Suga et al.
2004/0105155 A1* 6/2004 Hori et al. ................ 359/580

FOREIGN PATENT DOCUMENTS

| CN | 1685490 | 10/2005 |
| JP | 9-008451 | 1/1997 |
| JP | 11-340614 | 12/1999 |
| JP | 2002-064042 | 2/2000 |

(Continued)

OTHER PUBLICATIONS

English language Abstract of JP 2000-269269, Sep. 29, 2000.

(Continued)

*Primary Examiner*—M. Wilczewski
(74) *Attorney, Agent, or Firm*—Greenblum & Bernstein, P.L.C.

(57) ABSTRACT

A bonding method and an apparatus that enable metal bonding under the atmospheric pressure and at room temperature, wherein the surfaces of objects (1b, 2a) to be bonded together are cleaned in an initial cleaning step (S1) to remove bonding inhibitor substances (G) such as oxides and adhered substances; one (1b) of the bonding surfaces is provided with an uneven profile with a predetermined roughness in a surface roughness control step (S3); a surface treatment step (S5) is performed to remove the substances (F) that have been removed but adhered to the bonding surfaces (1b, 2a) again; and the uneven bonding surface (1b) is pressed against the other bonding surface (2a) to bond them together.

13 Claims, 6 Drawing Sheets

FOREIGN PATENT DOCUMENTS

| | | |
|---|---|---|
| JP | 2000-269269 | 9/2000 |
| JP | 2001-351892 | 12/2001 |
| JP | 2003-197673 | 7/2003 |
| WO | 2004/030076 | 4/2004 |

OTHER PUBLICATIONS

English language Abstract of CN 1685490, Oct. 19, 2005.
English Language Abstract of JP 11-340614, (1999).
English Language Abstract of JP 2000-269269, (2000).
English Language Abstract of JP 9-008451, (1997).
English Language Abstract of JP 2002-064042, (2002).
English Language Abstract of JP 2001-351892, (2001).
English Language Abstract of JP 2003-197673, (2003).
Ito et al., "MEMS Package ni Okeru Hyomen Kasseika Joon Setsugo no Kanosei," 2000 Nendo Seimitsu Kagakukai Shuki Taikai Gakujutsu Koenkai Koen Ronbunshu, 2000, p. 317.
Ochiai et al., "Hyomen Kasseika ni yoru Hikari Micro Buhin no Teion Chokusetsu Setugo," 2003 Nendo Seimitsu Kagakukai Shuki Taikai Gakujutsu Koenkai Koen Ronbunshu, 2003, p. 400.

* cited by examiner

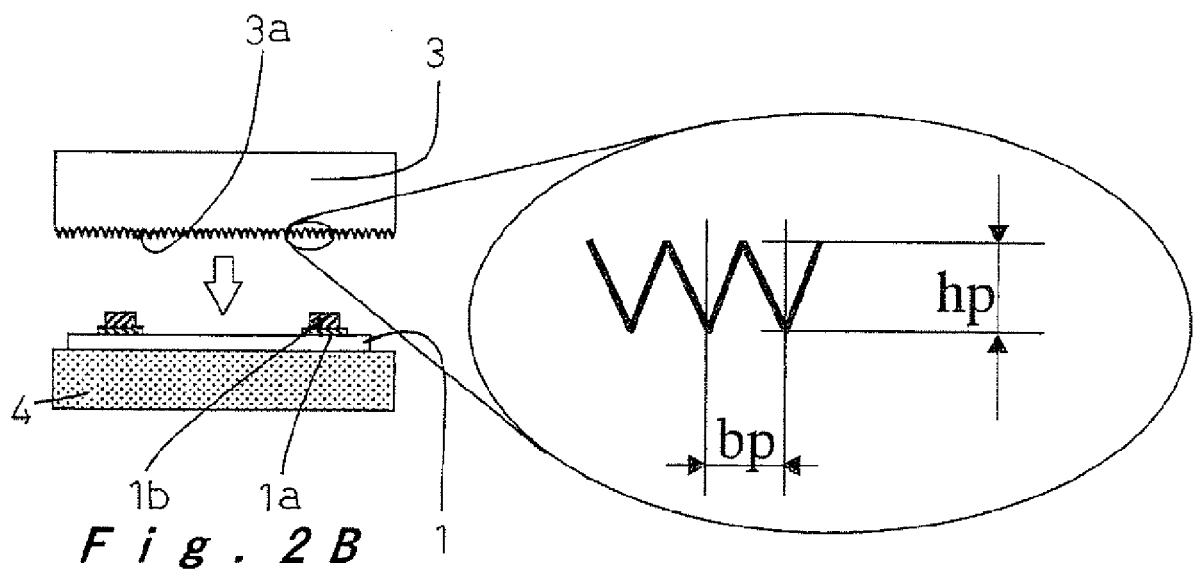
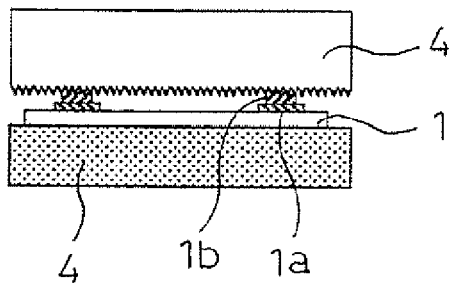
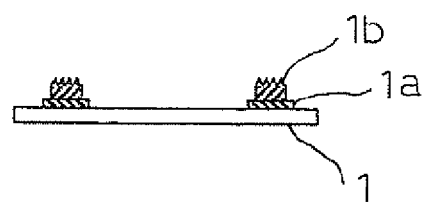

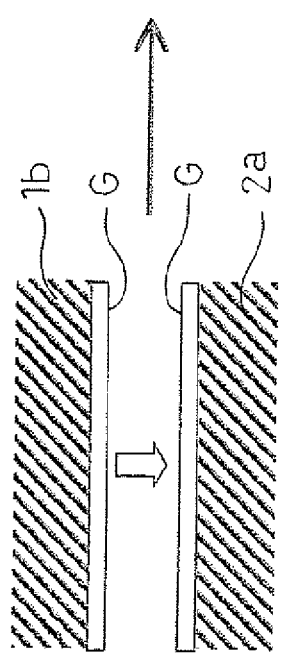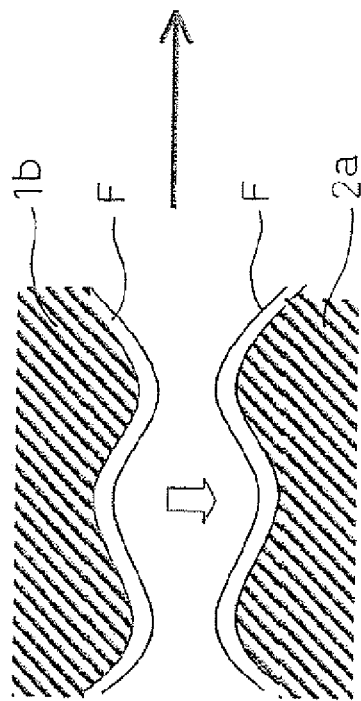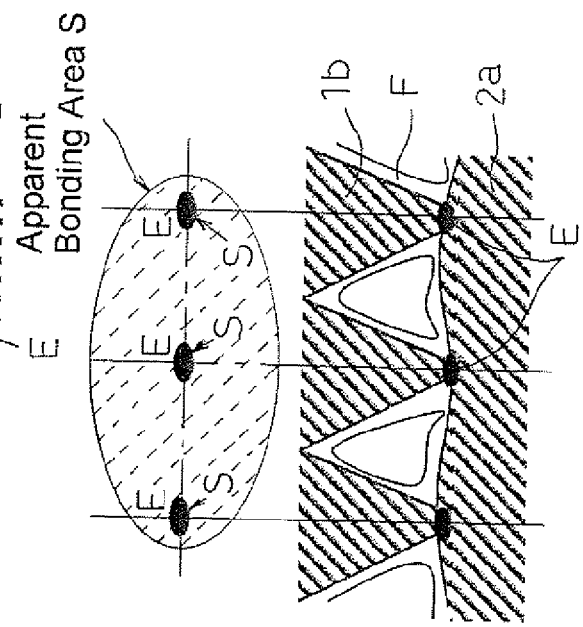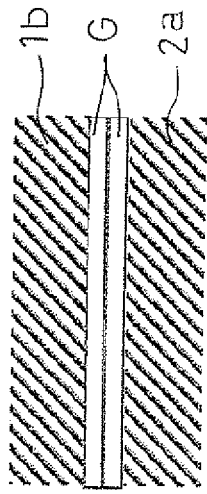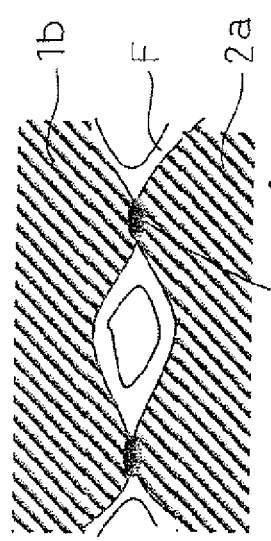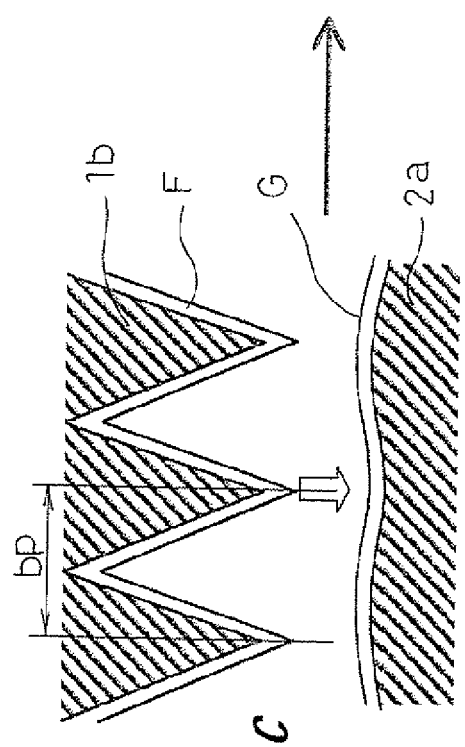
Fig. 5A  Fig. 5B  Fig. 5C

BONDING METHOD AND APPARATUS

TECHNICAL FIELD

The present invention relates to a bonding method and an apparatus applied for mounting electronic components on a substrate by directly bonding electrodes on the electronic components and on the substrate.

BACKGROUND ART

In one known component mounting method in which two or more objects are directly bonded together, the objects are placed inside a vacuum chamber and cleaned by directing energy waves onto their surfaces in a low-pressure gas atmosphere, after which the objects are faced opposite each other and pressed together, with the chamber sealed vacuum, or sealed with inactive gas or other gas that does not react with the objects (see, for example, Patent Document 1).

In another known bonding method in which Au bumps of electronic components are joined by metal bonding with Au film on the surface of connection terminals of the substrate, the substrate and electronic components are placed in a vacuum atmosphere inside a chamber, the Au bumps on the electronic components and Au film on the surface of the connection terminals of the substrate are cleaned by unidirectionally accelerated energy particles such as fast atom beam or ion beam, and while the vacuum atmosphere, or a certain gas atmosphere, is maintained, the bumps and connection terminals that have been activated by the cleaning are brought into contact with each other and pressure is applied, whereby they are joined under room temperature (see, for example, Patent Document 2). This conventional technique claims that bonding is also possible in the atmosphere, and within ten minutes during which the activated state achieved by the cleaning process can be maintained, bonding is performed in a temperature range of from room temperature to 150° C.

Patent Document 1: Japanese Patent Publication No. 2001-351892

Patent Document 2: Japanese Patent Publication No. 2003-197673

PROBLEMS TO BE SOLVED BY THE INVENTION

However, in the conventional bonding techniques, the transportation step after the cleaning step and the bonding step require at least one vacuum chamber or a chamber for creating an inactive gas atmosphere, as well as other necessary vacuum equipment such as vacuum pumps, valves, and controllers, because of which the equipment cost is higher as compared to bonding methods that use ultrasound and heat or that use a curable paste material. Also, production throughput is reduced by the time required for reducing gas pressure or sealing in gas and opening the chamber to atmosphere each time the substrate and electronic components are carried in and out of the chamber.

To solve the above problems, as with the conventional techniques disclosed in Patent Document 2, the transportation step after the cleaning and bonding step may be carried out in the atmosphere, so that no vacuum equipment is necessary for the bonding and that equipment cost for the bonding is reduced and production throughput improved. On the other hand, as this bonding method entails heat application, there arises another problem that oxides or other substances adhered on the bonding surfaces that impede bonding must be removed and that such substances must be strictly controlled and prevented from attaching to the bonding surfaces again.

Accordingly, an object of the present invention is to provide a bonding method and an apparatus, with which process steps, at least from the surface treatment step of removing bonding inhibitor substances to the bonding step, can be performed in the atmosphere and under room temperature.

MEANS FOR SOLVING THE PROBLEMS

To achieve the above object, one aspect of the present invention is a method of bonding surfaces of two or more objects after the objects have been surface-treated, including a surface roughness control step of processing at least one of the bonding surfaces to be bonded together so as to have a predetermined roughness, a surface treatment step of removing a bonding inhibitor substance from the bonding surfaces and attaching a bonding enhancer substance on the bonding surfaces, and a bending step of bringing the bonding surfaces of the two or more objects into contact with each other and bonding them.

With the above bonding method, one of the bonding surfaces to be bonded together is processed to have a predetermined roughness in a surface roughness control step, so that the bonding surface has a profile in which fine peaks are formed at fine intervals. When this bonding surface is pressed against the bonding surface of the other object in the bonding step, these peaks shear off the layer of bonding inhibitor substances such as oxides or adhered substances that exist on the bonding surfaces, and thus these peaks, which are substantially evenly distributed, or regularly arranged, are bonded to the other surface by metal bonding, whereby both objects are joined. The required joint strength depends on the sum of bending areas, i.e., the total sum of areas of bonding points between the fine peaks formed on one bonding surface and the other bonding surface. Therefore, a required joint strength can be achieved by suitably selecting the shape and size of the peaks of the bonding surface that is roughened in the surface roughness control step, and the biting amount of the roughened surface into the other bonding surface in the bonding step. Since bonding is performed under the absence of bonding inhibitor substances and under the existence of bonding enhancer substances because of the surface treatment step that is carried out in order to remove bonding inhibitor substances from the bonding surfaces and attaching bonding enhancer substances, firm joints are reliably formed between the peaks and other bonding surface without any impediment from bonding inhibitor substances and with the help of bonding enhancer substances.

As part of the surface treatment step of the above bonding method, it is preferable to perform initial surface cleaning before each step so as to remove bonding inhibitor substances that exist on the bonding surfaces, so that each step is carried out in a cleaner condition, and, after the surface cleaning, the bonding is possible in the atmosphere due to surface modification caused by adhesion of bonding enhancer substances under the existence of the substances that have been removed but adhered again.

The surface roughness processing/control step is performed in order to process and control the bonding surfaces to have an appropriate surface roughness when they have a surface roughness that is inappropriate for the materials to serve as a bonding surface. Various methods may be adopted, such as a method of transferring an uneven surface profile to one bonding surface using a tool formed with a profile having a predetermined roughness, a method using atmospheric plasma, or a blast treatment method wherein fine particles are blown.

The surface treatment step should preferably be carried out by a method of projecting energy particles or waves toward the bonding surfaces under the atmospheric pressure, which enables the bonding step to be performed under the atmospheric pressure and ax room temperature. More specifically, ultraviolet irradiation or irradiation of substances generated by atmospheric plasma is applicable, and by performing this surface treatment step at the same time with the bonding step, the objects are swiftly bonded after the bonding inhibitor substances have been removed and the bonding enhancer substances have been attached.

A bonding apparatus according to a second aspect of the present invention is an apparatus for bonding surfaces of two or more objects after the objects have been surface-treated, comprising surface treatment means for removing a bonding inhibitor substance from and attaching a bonding enhancer substance on at least one bonding surface that has been controlled to have a predetermined roughness, and bonding means for contacting the bonding surfaces of the two or more objects to bond them.

With the above bonding apparatus, one of the bonding surfaces is controlled to have a predetermined surface roughness, so that the bonding surface has a profile in which fine peaks are formed at fine intervals. When this bonding surface is pressed against the bonding surface of the other object in the bonding step, these peaks shear off the layer of bonding inhibitor substances such as oxides or adhered substances that exist on the bonding surfaces, and thus these regularly arranged peaks are bonded to the other bonding surface by metal bonding, whereby both objects are joined. The required joint strength depends on the sum of bonding areas, i.e., the total sum of areas of bonding points between the fine peaks formed on one bonding surface and the other bonding surface. Therefore, a required joint strength is achieved by suitably selecting the shape and size of the peaks of the bonding surface that is roughened in the surface roughness controlling, and the biting amount of the roughened surface into the other bonding surface using the bonding means. Since bonding inhibitor substances have been removed from the bonding surfaces and bonding enhancer substances have been attached using the surface treatment means, bonding is performed under the absence of bonding inhibitor substances and under the existence of bonding enhancer substances, and therefore firm joints are reliably formed between the peaks and other bonding surface without any impediment from bonding inhibitor substances and with the help of bonding enhancer substances.

The surface treatment means of the above bonding apparatus should preferably include initial surface cleaning means for removing bonding inhibitor substances that exist on the bonding surfaces before each treatment step by respective means, so that each step is carried out in a cleaner condition, and, after the surface cleaning, bonding is possible in the atmosphere due to surface modification caused by adhesion of bonding enhancer substances under the existence of the substances that have been removed but adhered again.

The above bonding apparatus should preferably include surface roughness processing/control means for processing the bonding surface to have a surface roughness appropriate for the material. Various methods are adopted, such as a method of transferring an uneven surface profile to one bonding surface using a tool formed with a profile having a predetermined roughness, a method using atmospheric plasma, or a blast treatment method wherein fine particles are blown.

The surface treatment means should preferably adopt a method of projecting energy particles or waves toward the bonding surfaces under the atmospheric pressure, which enables the bonding step to be performed under the atmospheric pressure and at room temperature. More specifically, ultraviolet irradiation or irradiation of substances generated by atmospheric plasma is applicable, and by performing this surface treatment step at the same time with the bonding, the objects are swiftly bonded after she bonding inhibitor substances have been removed or the bonding surfaces have been modified.

The bonding method of the present invention is a method of bonding surfaces of two or more objects after the objects have been surface-treated, including a surface treatment step of controlling at least one of the bonding surfaces to have a predetermined roughness, and modifying the bonding surfaces, on which no bonding inhibitor substances exist or from which bonding inhibitor substances have been removed, by letting bonding enhancer substances adhere under the existence of substances that adhere to the bonding surfaces in the atmosphere; and a bonding step of contacting the modified bonding surfaces of the two or more objects and bonding them, whereby room temperature bonding in the atmosphere becomes possible.

BRIEF DESCRIPTION OF THE DRAWINGS

FIG. 2A to FIG. 2C are schematic views illustrating the surface roughness control step;

FIG. 5A to FIG. 5C are schematic views for explaining the bonding between the bonding surfaces that are roughness-controlled.

BEST MODE FOR CARRYING OUT THE INVENTION

This embodiment shows one example of the method applied for mounting electronic components on a substrate by bonding bump electrodes formed on the electrode lands of the electronic components to the electrode lands formed on the substrate. The bump electrodes may be formed on the electrode lands of the substrate, or may be formed on the electrode lands of both of the substrate and components. Electrode lands generally have a thickness of 1 μm or smaller, and therefore bump electrodes of several to several tens μm are essential as a shock absorber to accommodate warp of the electronic components and substrate and to ensure establishment of electrical connection by the bonding between the plurality of electrode lands on the electronic component and substrate.

Figure 1:
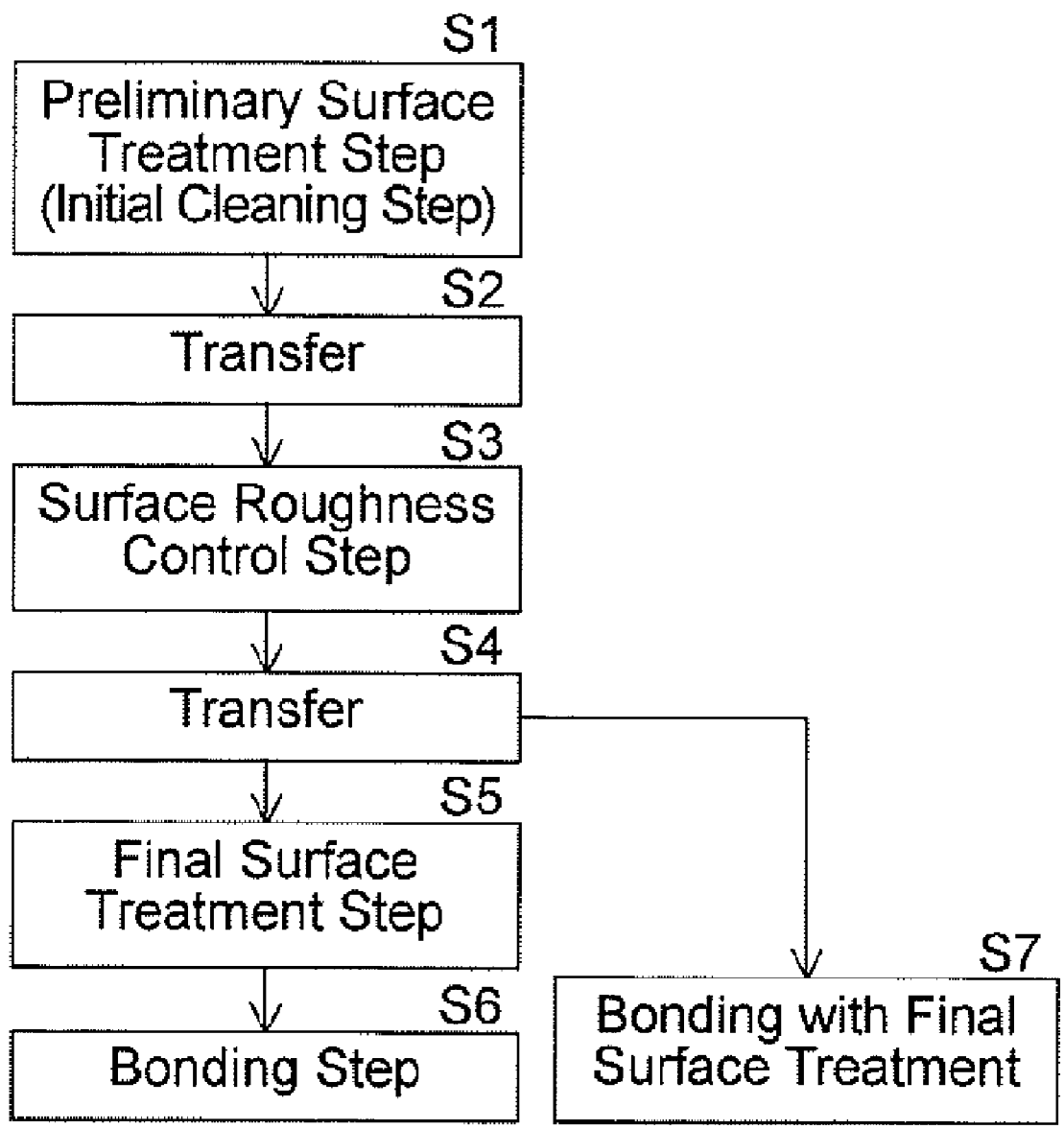
FIG. 1 is a flowchart of the process steps of one embodiment of the bonding method.

FIG. 1 shows the process steps of this embodiment of the bonding method, each of which will be described hereinafter with reference to FIG. 2A to FIG. 4. Alphanumerals S1, S2, etc. in FIG. 1 denote the process steps and correspond to those referred to in the description.

Initial cleaning is the first step (S1), which is performed as a preliminary surface treatment step, to clean the bump electrodes 1b of the electronic components 1 and electrode lands 2a of the substrate 2. The initial cleaning may be performed either in the atmosphere or in vacuum, using energy particles or ion beam created by plasma, or by wet chemical etching. By this initial cleaning step, oxides or adhered substances on the surfaces of the bump electrodes 1b and electrode lands 2a, which inhibit the bonding, are removed, and the metal forming the bump electrodes 1b and electrode lands 2a is exposed. If the bonding surfaces are made of material such as Si which is free, or almost free, of bonding inhibitor substances, then the initial cleaning step may be omitted and the main surface treatment to be described later only may be performed.

The electronic component 1 that underwent the initial cleaning is transported onto a surface treatment stage 4 on which the surface roughness control step is performed, while the substrate 2 is transported onto a bonding stage 7 (S2). In the surface roughness control step, the surface of the bump electrodes 1b is processed to have a predetermined roughness (S3). This surface roughness control step is carried out as follows: As shown in FIG. 2A, a rough surface plate (surface roughening member) 3 with a rough surface 3a having a predetermined roughness is lowered toward the electrode bumps 1b of the electronic component 1 held on the stage 4; and as shown in FIG. 2B, a predetermined pressure is applied to the bump electrodes 1b, and the rough surface plate 3 is separated from the bump electrodes 1b and lifted up, whereby uneven surface profile is created on the surface of the bump electrodes 1b as shown in FIG. 2C. The effects of the formation of this uneven surface profile will be described later in detail.

Figure 3A:
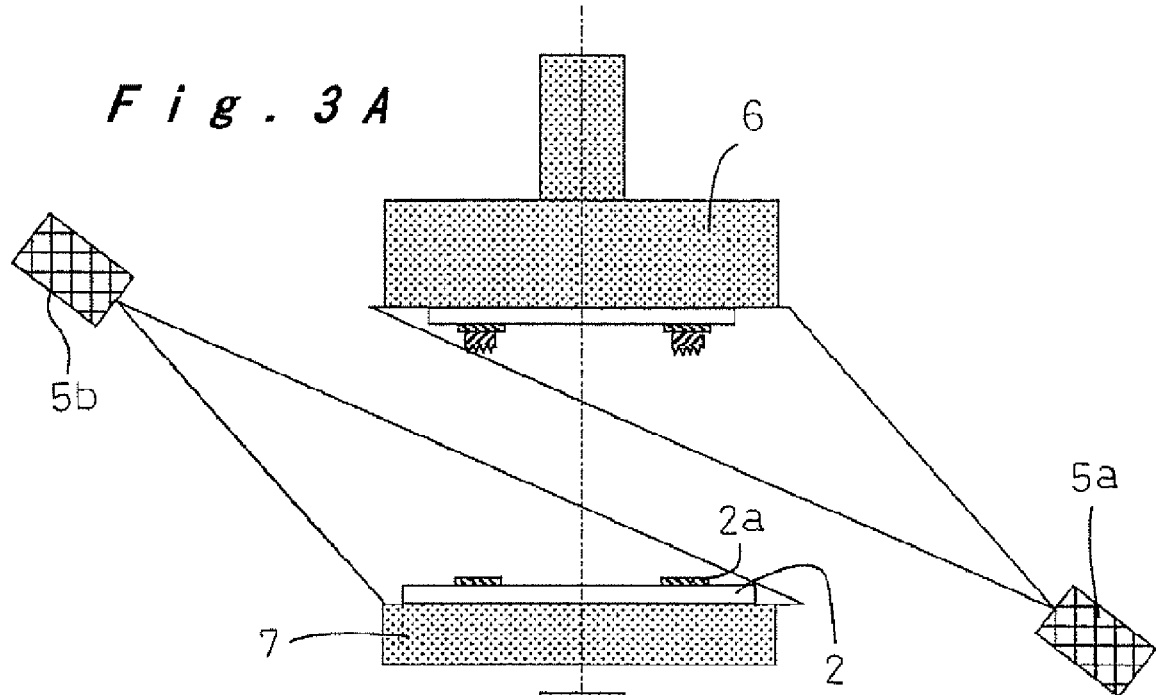
FIG. 3A to FIG. 3C are schematic views illustrating the bonding step and surface cleaning step.

After the surface roughness processing/control step described above in which the bump electrodes 1b are controlled and processed to have a rough surface, the electronic component 1 is transported (S4) to the bonding step, where, as shown in FIG. 3A, it is held by a bonding tool (bonding means) 6 and positioned above the bonding stage 7 on which the substrate 2 is held, so that the bump electrodes 1b and electrode lands 2a are in matching positions.

In the state shown in FIG. 3A, ultraviolet light is projected to the electronic component 1 from a first ultraviolet irradiation device (surface treatment means) 5a as illustrated, while ultraviolet light is projected to the substrate 2 from a second ultraviolet irradiation device (surface treatment means) 5b, so as to remove the bonding inhibitor substances that have adhered to the hump electrodes 1b and electrode lands 2a after the initial cleaning and to perform the main surface treatment step (surface treatment step) to allow adhesion of bonding enhancer substances under the existence of the substances that have been removed but adhered again (S5).

Figure 3B:
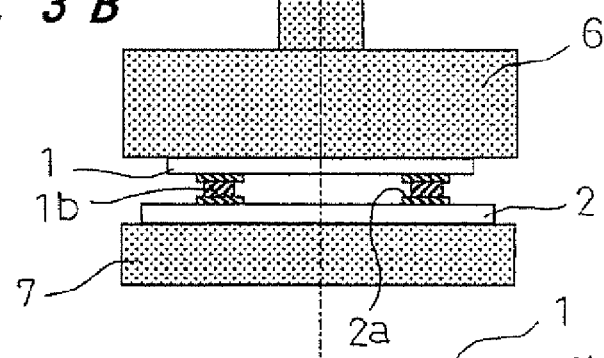

After a predetermined period of the main surface treatment step, the bonding tool 6 is lowered, and when the bump electrodes 1b of the electronic component 1 are brought in pressure contact with the electrode lands 2a of the substrate 2 as shown in FIG. 3B, the bump electrodes 1b bond to the electrode lands 2a in the protruded portions on their surfaces (S6). This bonding mechanism will be described later in detail.

Figure 3C:
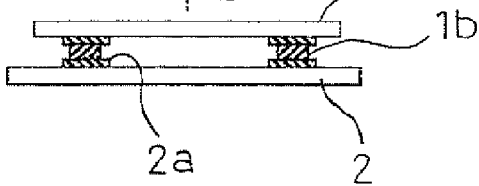

After the bump electrodes 1b and electrode lands 2a have been bonded, the bonding tool 6 releases the electronic component 1 and goes up, and thus the electronic component 1 is mounted on the substrate 2 as shown in FIG. 3C, with the bump electrodes 1b and electrode lands 2a being bonded together.

The second cleaning step described above is preferably continued until after the bonding step is complete (S7). Alternatively, oxygen may be blown in order to help removal of adhered substances by the ultraviolet light.

The effects of the surface treatment of the bump electrodes 1b performed in the above-described surface roughness control step, and the bonding mechanism between the surface-treated bump electrodes 1b and the electrode lands 2 are described below in detail.

Figure 4:
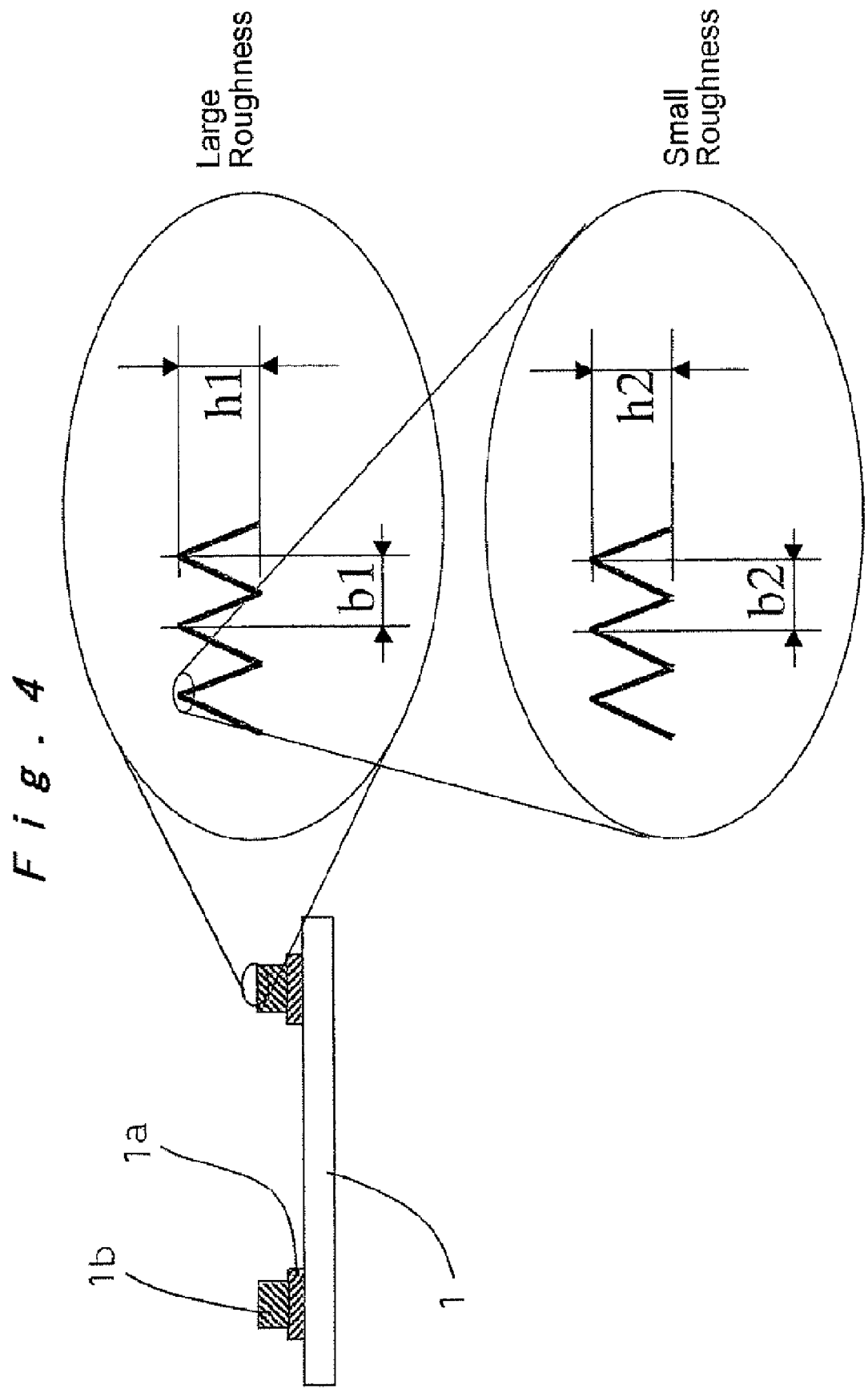
FIG. 4 is a schematic view for explaining surface roughness.

Bump electrodes 1b are most commonly formed by electrolytic or electroless plating, or provided by stud bump bonding. Their surface has a ten-point mean roughness or undulation in the order of micrometers, and each segment of the undulation has undulation in the order of nanometers. The undulation in the order of micrometers (ten-point roughness) is defined as large roughness and the undulation in the order of nanometers (ten-port roughness) is defined as small roughness here; the large roughness is measured with a roughness measurement device or using laser, but the small is roughness is only measured at as a high resolution as atomic force microscopes. FIG. 4 shows triangular approximations of the large roughness and small roughness, where the peaks are denoted at h1 and h2, and the amplitude of the waves are denoted at b1 and b2, respectively; generally, the large roughness of sputtered gold (Au) film bump electrodes 1b has a peak h1 of a submicrometer level, while the small roughness has a peak h2 of about 10 nm; and the large roughness of plated bump electrodes 1b has a peak h1 of several micrometers, while the small roughness has a peak h2 of about 50 nm.

Before the preliminary cleaning and/or main surface treatment, in the atmosphere, there are bonding inhibitor substances G such as oxides or organic matter adhered on the surfaces of the bump electrodes 1b and electrode lands 2a as shown in FIG. 5A, because of which the metal surfaces would fail to bond to each other as they are not directly in contact with each other. The initial cleaning removes the inhibitor substances G from the metal surfaces so that they are ready to react with other substances, and metal bonding is possible if they are brought into contact with each other. However, the metals fail to bond with each other in the atmosphere or in a vacuum of about $1 \times 10^{-4}$ Pa, because the inhibitor substances G that have been removed adhere on the metal again. The bonding would only be possible in such a condition if, as shown in FIG. 5B, the metal surfaces, i.e., the surfaces of the bump electrodes 1b and electrode lands 2a, have large and small undulations, and if the tops of the undulation coincide in position with each other. In this case, when the bump electrode 1b is pressed against the electrode land 2a, the layer of re-adhered substances F is sheared off and nascent metal surfaces are created at the interface, which are highly reactive and therefore the two metal surfaces bond to each other in these areas or joints E by metal bonding. Such joints E, however, are created fairly randomly and there is no guarantee that firm joints are always formed, and also there will be variation in the joint strength.

The present invention applies the above-described bonding mechanism to a mass production process; to achieve stable joints, the rough surface 3a of the rough surface plate 3 has a standardized unevenness with large roughness parameters h1 and b1. This rough surface plate 3 having a rough surface 3a formed with an uneven profile with a peak distance of bp and a peak height of hp as shown in FIG. 2 is pressed against the bump electrodes 1b to form unevenness on their surfaces as shown in FIG. 5C, with which a controlled number of joints E with the electrode lands 2a will be formed. By thus controlling the roughness in the surface roughness control step, it is ensured that there will be areas where the layers of re-adhered substances are sheared off, and consequently the joint strength quality is controlled in the mass production process.

Where

E: joint, bp: distance between two joints (designed peak distance of the unevenness on the rough surface plate 3), s: bonding area at the joint (theoretical value defined by the shape and size of the joint E, and biting amount at the joint E), Sc: bonding area per unit area, S: measured bonding area (actual value), and So: total bonding area, the ratio of unit area 1 to the area $(bp)^2$ of a square with four joints E and a side length of bp is equal to the ratio of the bonding area per unit area Sc to the bonding area s (which is the sum of the four joints, 4×S/4, the bonding area per one joint being s/4). Thus the following equation (1) is set up:

$$1:(bp)^2=Sc:s \quad (1)$$

Here, the measured bonding area S, unlike the bonding area s which represents the effective bonding area at the joint E, includes non-bonding areas as well as effective bonding areas as shown in FIG. 5C; it represents a total sum of the measured areas of projections, which are visually recognized as joints.

From the equation (1) above, the bonding area per unit area Sc is obtained by the following equation (2), and the total sum of the actual bonding areas So is expressed as the following equation (3), as it is a product of the apparent bonding area S and the bonding area per unit area Sc. By substituting equation (2) into equation (3), the following equation (4) is obtained:

$$Sc=s/(bp)^2 \quad (2)$$

$$So=S \times Sc \quad (3)$$

$$So=S \times s/(bp)^2 \quad (4)$$

If the correlation between the above total sum of bonding areas So and joint strength is known, it is easily determined how much total bonding area So is required to obtain a certain joint strength, and the bonding area s, or the distance bp between the joints, that is required to obtain the total sum of bonding areas So can be determined from the equation (4). The bonding area s is determined by suitably selecting the parameters such as the shape, size, and biting amount of one joint that will be formed by the rough surface 3a of the rough surface plate 3.

The rough surface 3a of the rough surface plate 3 is formed by dry etching or sand blast methods so that it has cyclic roughness. The peak height hp and peas distance bp depend on the surface condition, size, and material of the bump electrodes 1b. In this embodiment, the bump electrodes 1b are made of gold, and, taking into consideration that the bonding surface area per one electrode may be as small as 30 $\mu m^2$, hp is set in a range of 2 to 5 μm, preferably 3 μm, and bp is set in a range of 1 to 3 μm, preferably 1.7 μm. These values will vary, however, depending on the materials to be bonded together; for the bonding of objects that are both made of silicon which is hard, the roughness will be made finer.

Even with the standardized joints E provided by the above roughening process, there still is a worry that there may be variation in the joint achieved degree at the joints E depending on the amount of the re-adhered substances F, and sometimes the bonding does fail. The main surface treatment step is performed to solve this problem; it is performed to manage and control the chemical state of metal surfaces in the atmosphere, with the intention of removing bonding inhibitor substances from the re-adhered substances F and of letting bonding enhancer substances attach on the surfaces. Here in the main surface treatment, ultraviolet light is projected to the bump electrodes 1b on the electronic component 1 from a first ultraviolet irradiation device 5a, while ultraviolet light is projected to the electrode lands 2a on the substrate 2 from a second ultraviolet irradiation device 5b, so as to remove the bonding inhibitor substances from the re-adhered substances F and to let bonding enhancer substances attach on the surfaces by the use of ultraviolet. As a result, even under the existence of residual adhered substances, the bonding enhancer substances help mitigate or eliminate the effects of the residual adhered substances, whereby successful bonding is achieved. This is assumed to be because the bonding enhancer substances promote the shearing of the residual adhered substance layers at the joints. That is, the bonding enhancer substances are assumed to modify the bonding surface conditions so that the residual adhered substance layers do not inhibit the bonding.

In the above described process, the electronic component 1 is brought onto the surface treatment stage 4 for the transfer of the uneven profile after the initial cleaning step which is performed as a preliminary surface treatment. Alternatively, after the initial cleaning step, the electron component 1 may be held by a bonding tool 6 and lowered onto the rough surface plate 3 that has the rough surface 3a faced upwards, to press the bump electrodes 1b of the electronic component 1 against the rough surface 3a for the transfer of the uneven profile on the surface of the bump electrodes 1b.

Instead of transferring the uneven profile using the rough surface plate 3 that has been described as means of performing the surface roughness processing/control step, the uneven profile or roughness may be directly formed by plasma treatment or blast treatment. Alternatively, the roughness may be provided by irradiation of ions or the like generated by atmospheric plasma, which has been described as means of performing the main surface treatment step.

Heating the electronic component 1 and substrate 2 to a temperature of about 50 to 250° C. in the bonding step increases the diffusion speed of the metal, whereby the bonding strength is further enhanced.

While the bump electrodes 1b of the electronic component 1 undergo the surface roughness control step in the above described process, the same effects will he achieved if the electrode lands 2a of the substrate 2 undergo the roughening treatment.

Next, one example of the best mode to carry out the process in the order of the following first to fourth steps and its results will be described:

1. Au stud bumps 1b were formed on the electronic component 1;

2. Roughening step was performed as a surface roughness processing/control step, in which a regular uneven pattern was provided on the Au surface of the electronic component 1 which will be bonded, using a mold made by etching from a Si substrate (inclination angle: 54.7°, anisotropy etching depth: 1.7 μm, peak distance: 3 μm);

3. Surface-roughened Au bumps on the electronic component 1 and Au-sputtered electrodes en another electronic component 2 underwent surface treatment at the same time using UV lamps to remove bonding inhibitor substances and to attach bonding enhancer substances (low pressure mercury lamp with 185 to 254 nm wavelengths, 20 mW/cm$^2$ intensity, and 90 seconds illumination time);

4. One or both of the electronic components 1 and 2 were heated so that the bonding surfaces were 100° C., and they were pressed together to cause cohesion bonding and/or diffusion bonding to join them.

The joint between the Au—Au surfaces obtained through the above process steps had a uniform shear rupture strength of 200 mN with a bonding area of 50 µm diameter (1963 µm$^2$). When Ar plasma cleaning was performed (200 W, 30 s) as the initial cleaning step, the joint was improved in strength and had a sheer rupture strength of 300 mN or more. Note, shear rupture occurred also in parts other than the bonding interface, and therefore the joint strength was not quantified but the result was good enough to guarantee a high joint strength.

Figure 6A:
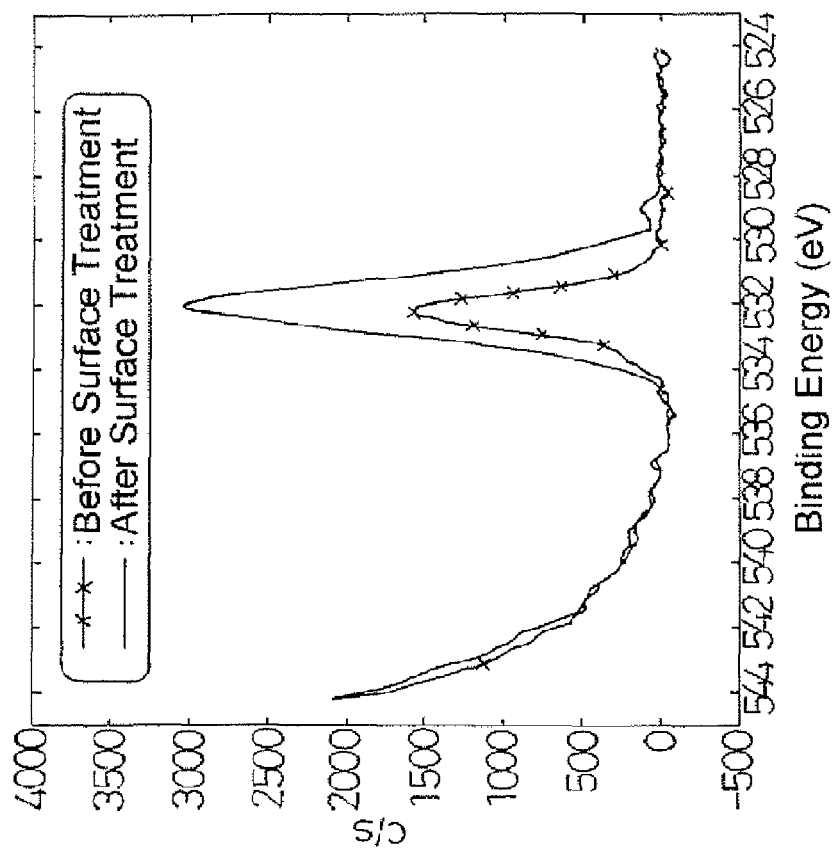
FIG. 6A and FIG. 6B are graphs plotting the amount of bonding inhibitor substances and of bonding enhancer substances before and after the main surface treatment.
Figure 6B:
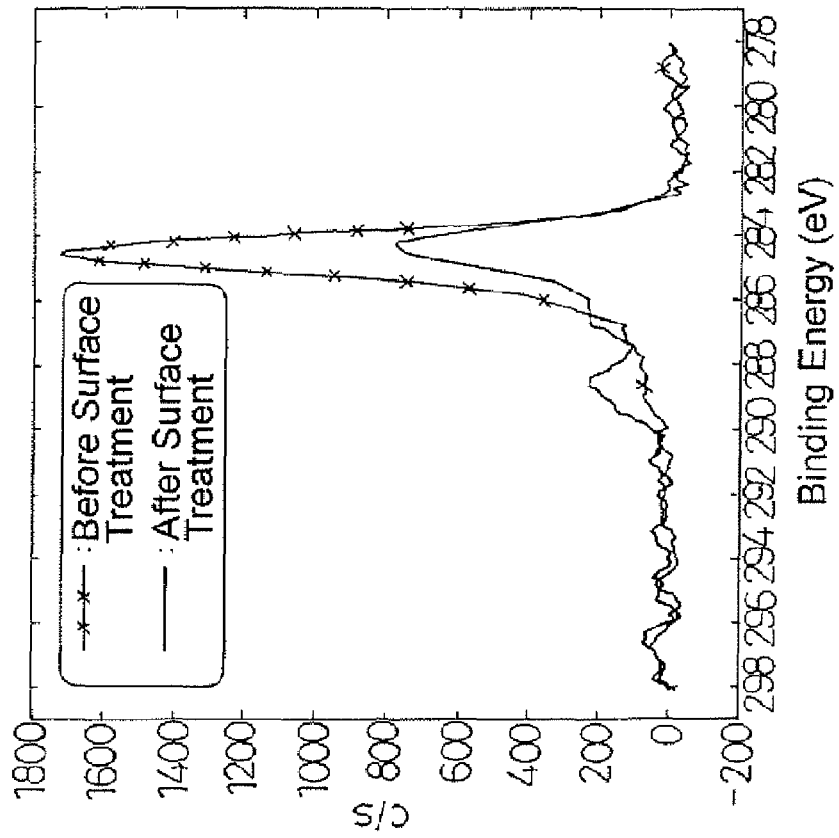

The higher the temperature relative to room temperature was, the better the bonding result was. Further, before and after the main surface treatment, the peak amount of carbon C was reduced as shown in FIG. 6A and the peak amount of oxygen O was increased as shown in FIG. 6B. This leads us to the assumption that the metal surfaces were modified into conditions that were favorable for the bonding because carbon C was removed and oxygen O increased, leading to the above favorable results. Thus, C is defined as a bonding inhibitor substance, and O a bonding enhancer substance.

INDUSTRIAL APPLICABILITY

According to the present invention, as described above, the surfaces of the objects to be bonded are cleaned in a first cleaning step to remove bonding inhibitor substances such as oxides and adhered substances; one of the bonding surfaces is provided with an uneven profile with a predetermined roughness in a surface roughness control step; a second cleaning step is performed to remove the substances that have been removed but adhered to the bonding surfaces again; and the uneven bonding surface is pressed against the other bonding surface, whereby both surfaces are bonded at room temperature and in the atmosphere; the invention is therefore effectively applicable to flip-chip-type electronic component mounting techniques.

The invention claimed is:

1. A method of bonding surfaces of two or more objects after the objects have been surface-treated, comprising:
    surface-treating by controlling at least one of the bonding surfaces to be bonded together so as to have a predetermined roughness in which the bonding surface has a profile including fine peaks formed at close intervals, and removing a bonding inhibitor substance from the bonding surfaces by pressing the bonding surface having fine peaks formed at close intervals against the other of the bonding surfaces so that the fine peaks shear a layer of bonding inhibitor substance from the other of the bonding surfaces, and attaching a bonding enhancer substance on the bonding surfaces; and
    bonding by bringing the bonding surfaces of the two or more objects into contact with each other and bonding them.

2. The bonding method according to claim 1, wherein the surface-treatment step includes an initial surface cleaning step of removing bonding inhibitor substances that exist on the bonding surfaces.

3. The bonding method according to claim 1, wherein each step is performed under the atmospheric pressure.

4. The bonding method according to claim 1, wherein, when the bonding surface has a surface roughness that is inappropriate for the materials to serve as a bonding surface, controlling of the surface roughness include a step of processing and controlling the bonding surfaces to have an appropriate surface roughness.

5. The bonding method according to claim 4, wherein the surface roughness process/control step performs transferring an uneven surface profile to one bonding surface using a tool formed with a profile having a predetermined roughness.

6. The bonding method according to claim 4, wherein the surface roughness process/control step is a method using atmospheric plasma.

7. The bonding method according to claim 4, wherein the surface roughness processing/control step is a blast treatment method wherein fine particles are blown.

8. The bonding method according to claim 1, wherein the surface-treatment step includes projecting energy particles or waves toward the bonding surfaces under the atmospheric pressure.

9. The bonding method according to claim 1, wherein the surface-treatment step is performed at the same time with the bonding step.

10. The bonding method according to claim 1, wherein the surface-treatment step includes ultraviolet irradiation.

11. The bonding method according to claim 1, wherein the surface-treatment step includes irradiation of substances generated by atmospheric plasma.

12. The bonding method according to claim 1, wherein the bonding step is performed at room temperature.

13. A method of bonding surfaces of two or more objects after the objects have been surface-treated, comprising:
    surface-treating by controlling at least one of the bonding surfaces to have a predetermined roughness in which the bonding surface has a profile including fine peaks formed at close intervals, and modifying the bonding surfaces by pressing the bonding surface having fine peaks formed at close intervals against the other of the bonding surfaces so that the fine peaks shear a layer of bonding inhibitor substance from the other of the bonding surfaces, on which no bonding inhibitor substances exist or from which bonding inhibitor substances have been removed, by letting bonding enhancer substances adhere under the existence of substances that adhere to the bonding surfaces in the atmosphere; and
    bonding by contacting the modified bonding surfaces of the two or more objects and bonding them.

* * * * *